United States Patent
Kuno et al.

(10) Patent No.: US 12,531,218 B2
(45) Date of Patent: Jan. 20, 2026

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

(*) Notice: Subject to any disclaimer, the term of this patent is extended or adjusted under 35 U.S.C. 154(b) by 247 days.

(21) Appl. No.: 18/157,207

(22) Filed: Jan. 20, 2023

(65) Prior Publication Data
US 2023/0317432 A1  Oct. 5, 2023

(30) Foreign Application Priority Data
Mar. 31, 2022  (JP) .................. 2022-058341

(51) Int. Cl.
  *H01J 37/32*  (2006.01)
  *B32B 3/26*  (2006.01)
  *B32B 7/12*  (2006.01)
  *B32B 18/00*  (2006.01)

(52) U.S. Cl.
  CPC ........ *H01J 37/32724* (2013.01); *B32B 3/266* (2013.01); *B32B 7/12* (2013.01); *B32B 18/00* (2013.01); *H01J 2237/002* (2013.01)

(58) Field of Classification Search
  CPC .......... H01J 37/32724; H01J 2237/002; B32B 3/266; B32B 7/12; B32B 18/00
  See application file for complete search history.

(56) References Cited

U.S. PATENT DOCUMENTS

| | | | |
|---|---|---|---|
| 6,108,190 A | 8/2000 | Nagasaki | |
| 7,337,745 B1* | 3/2008 | Komino | H01L 21/6831 118/724 |
| 9,909,197 B2* | 3/2018 | Lee | H01J 37/32568 |
| 12,097,665 B2* | 9/2024 | Parkhe | H01L 21/68757 |
| 2004/0123805 A1* | 7/2004 | Tomoyoshi | H01L 21/6831 118/724 |
| 2005/0118450 A1 | 6/2005 | Fujii et al. | |
| 2009/0168292 A1 | 7/2009 | Watanabe et al. | |
| 2020/0118860 A1* | 4/2020 | Lee | H01L 21/67109 |

(Continued)

FOREIGN PATENT DOCUMENTS

| | | |
|---|---|---|
| CN | 213660345 U | 7/2021 |
| JP | H11-163109 A | 6/1999 |

(Continued)

OTHER PUBLICATIONS

Taiwanese Office Action dated Feb. 6, 2024 (Application No. 112106029).

(Continued)

*Primary Examiner* — Gordon A Jones
(74) *Attorney, Agent, or Firm* — BURR PATENT LAW, PLLC

(57) ABSTRACT

In a wafer placement table, a cooling plate having a refrigerant flow channel is provided on a bottom surface side of a ceramic plate incorporating an electrode. A gas intermediate passage that is a horizontal space is provided parallel to a wafer placement surface at a location closer to the wafer placement surface than the refrigerant flow channel in the wafer placement table and has an overlapping part that overlaps the refrigerant flow channel along the refrigerant flow channel in plan view.

9 Claims, 10 Drawing Sheets

(56) References Cited

U.S. PATENT DOCUMENTS

| | | | |
|---|---|---|---|
| 2020/0163193 A1 | 5/2020 | Ueda | |
| 2020/0279765 A1* | 9/2020 | Furukawa | H01L 21/68757 |
| 2020/0286755 A1* | 9/2020 | Ito | H01L 21/67109 |
| 2020/0312684 A1 | 10/2020 | Mine et al. | |
| 2021/0043476 A1 | 2/2021 | Koizumi et al. | |
| 2021/0050240 A1 | 2/2021 | Moyama et al. | |
| 2021/0143043 A1 | 5/2021 | Hwang et al. | |
| 2021/0272834 A1 | 9/2021 | Takayama | |
| 2021/0358726 A1 | 11/2021 | Ko et al. | |
| 2022/0190749 A1* | 6/2022 | Onuma | H02N 13/00 |
| 2025/0125126 A1* | 4/2025 | Usui | C04B 38/00 |

FOREIGN PATENT DOCUMENTS

| | | |
|---|---|---|
| JP | 2002-327275 A | 11/2002 |
| JP | 2003-188247 A | 7/2003 |
| JP | 2005-101108 A | 4/2005 |
| JP | 2009-158829 A | 7/2009 |
| JP | 2014-150186 A | 8/2014 |
| JP | 2016-072478 A | 5/2016 |
| JP | 2016-174060 A | 9/2016 |
| JP | 2017-220542 A | 12/2017 |
| JP | 2019-110253 A | 7/2019 |
| JP | 2020-088048 A | 6/2020 |
| JP | 2020-145238 A | 9/2020 |
| JP | 2020-161597 A | 10/2020 |
| JP | 2021-028961 A | 2/2021 |
| JP | 2021-034390 A | 3/2021 |
| JP | 2021-057468 A | 4/2021 |
| JP | 2021-141116 A | 9/2021 |
| JP | 2021-180308 A | 11/2021 |
| TW | 202040728 A | 11/2020 |
| WO | 2020/167451 A1 | 8/2020 |

OTHER PUBLICATIONS

Korean Office Action (with English translation) dated Jul. 9, 2024 (Application No. 10-2023-0022256).

Japanese Third Party Submission (with English translation) dated Apr. 16, 2024 (Application No. 2022-058341).

Japanese Third Party Submission dated Oct. 22, 2024 (Application No. 2022-058341).

Japanese Office Action (with English translation) dated Sep. 3, 2024 (Application No. 2022-058341).

Japanese Office Action (with English translation) dated Jan. 21, 2025 (Application No. 2022-058341).

* cited by examiner

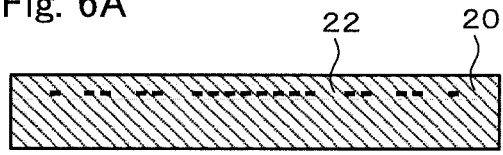
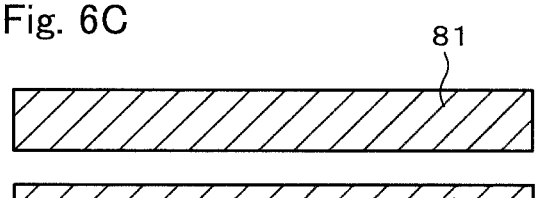
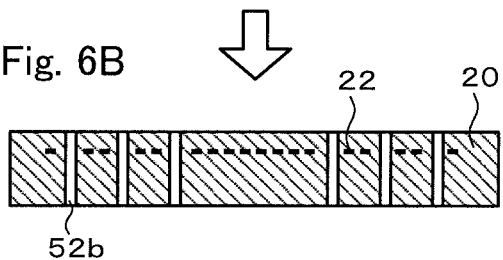
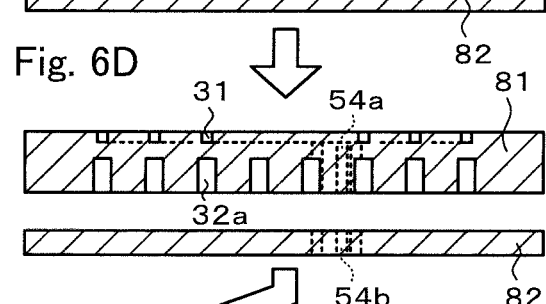
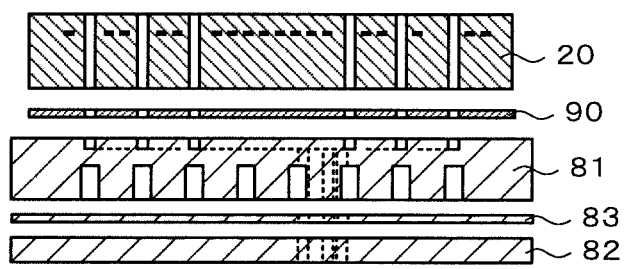
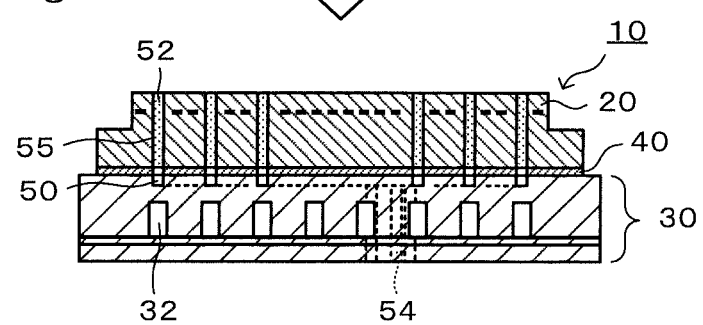

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic plate having a wafer placement surface on its top surface and incorporating an electrode, and a metal cooling plate bonded to the bottom surface of the ceramic plate. Patent Literature 1 describes such a wafer placement table that includes a gas intermediate passage parallel to a wafer placement surface inside a ceramic plate, a plurality of gas supply passages extending from the gas intermediate passage to the wafer placement surface, and a gas introduction passage extending through a cooling plate in an up and down direction and communicating with the gas intermediate passage. As for the number of gas supply passages and the number of gas introduction passages, provided for the gas intermediate passage, the number of gas introduction passages is smaller. Thus, the number of the gas introduction passages that pass in the up and down direction between parts of a refrigerant flow channel is smaller than the number of the gas supply passages, so the soaking performance of a wafer is improved.

CITATION LIST

Patent Literature

PTL 1: JP 2003-188247 A

SUMMARY OF THE INVENTION

However, in Patent Literature 1, part of a wafer directly above the refrigerant flow channel receives a higher cooling effect from refrigerant than the other part, so there is a problem that the part tends to decrease in temperature.

The present invention is made to solve such a problem, and it is a main object to further improve the soaking performance of a wafer.

[1] A wafer placement table according to the present invention is a wafer placement table in which a cooling plate having a refrigerant flow channel is provided on a bottom surface side of a ceramic plate having a wafer placement surface on its top surface and incorporating an electrode, and includes a horizontal space provided parallel to the wafer placement surface at a location closer to the wafer placement surface than the refrigerant flow channel in the wafer placement table and having an overlapping part that overlaps the refrigerant flow channel along the refrigerant flow channel in plan view.

The wafer placement table includes a horizontal space. The horizontal space is provided parallel to the wafer placement surface at a location closer to the wafer placement surface than the refrigerant flow channel in the wafer placement table and has an overlapping part that overlaps the refrigerant flow channel along the refrigerant flow channel in plan view. Since the horizontal space is a cavity, a part where the horizontal space is formed transfers less heat than a part where the horizontal space is not formed. Part of a wafer directly above the refrigerant flow channel tends to decrease in temperature due to refrigerant. However, a decrease in temperature is suppressed by the overlapping part of the horizontal space that is difficult to transfer heat. As a result, the soaking performance of a wafer improves.

The term "horizontal space" may be provided anywhere as long as the location is closer to the wafer placement surface than the refrigerant flow channel in the wafer placement table. For example, the horizontal space may be provided in the ceramic plate, may be provided in the cooling plate, or may be provided between the ceramic plate and the cooling plate. The state "parallel" includes not only a completely parallel state but also a state that falls within the range of an allowable error (for example, tolerance) even when the state is not completely parallel.

[2] In the above-described wafer placement table (the wafer placement table described in [1]), the refrigerant flow channel may be provided so as to be routed in a one-stroke pattern from one end to the other end in accordance with multiple circles disposed such that a plurality of imaginary circles having different diameters does not overlap each other in plan view, and the horizontal space may be provided in an annular shape so as to overlap any one of the plurality of imaginary circles in plan view. With this configuration, it is easy to increase the overlapping part of the horizontal space.

[3] In the above-described wafer placement table (the wafer placement table described in [2]), the horizontal space may be configured not to overlap an outermost peripheral imaginary circle of the plurality of imaginary circles. In processing a wafer with plasma, the outermost peripheral region of the wafer tends to have a relatively high temperature. Therefore, it is preferable to actively dissipate heat from the outermost peripheral region of a wafer by not providing the horizontal space in part of the refrigerant flow channel directly above the outermost peripheral region.

[4] In the above-described wafer placement table (the wafer placement table described in any one of [1] to [3]), the horizontal space may be a gas intermediate passage through which gas passes. The thus configured wafer placement table may include a plurality of gas supply passages extending from the gas intermediate passage to the wafer placement surface, and a gas introduction passage provided so as to extend through the cooling plate in an up and down direction between parts of the refrigerant flow channel and communicate with the gas intermediate passage, the number of the gas introduction passages being smaller than the number of the gas supply passages communicating with the gas intermediate passage. When gas is introduced through the gas introduction passage that is open at the bottom surface of the cooling plate, the gas passes through the gas intermediate passage and is distributed to the plurality of gas supply passages, and the gas is supplied to the bottom surface of a wafer. In the wafer placement table, the number of the gas introduction passages extending through the cooling plate is smaller than the number of the gas supply passages. Therefore, in comparison with the case where the number of the gas introduction passages extending through the cooling plate is equal to the number of the gas supply passages, the soaking performance of a wafer improves.

[5] In the above-described wafer placement table (the wafer placement table described in [4]), the cooling plate may be an electrically conductive plate or may include at least an electrically conductive plate in an upper layer, the electrically conductive plate may be bonded to a bottom surface of the ceramic plate via an electrically conductive bonding layer, and the gas intermediate passage may be provided at an interface between the electrically conductive bonding layer and the electrically conductive plate. With this configuration, the electrically conductive bonding layer that forms the top surface of the gas intermediate passage and the electrically conductive plate that forms the bottom surface of the gas intermediate passage are in contact with each other and have the same potential. Therefore, no potential gradient occurs between the upper and lower sides of the gas intermediate passage, so electrical discharge in the gas intermediate passage is prevented.

[6] In the above-described wafer placement table (the wafer placement table described in [5]), each of the gas supply passages may have an electrical insulating porous plug, and a lower end of the porous plug may be in contact with at least one of the electrically conductive bonding layer or the electrically conductive plate. With this configuration, the lower end of the porous plug has the same potential as the electrically conductive bonding layer and the electrically conductive plate. For this reason, no potential gradient occurs between the lower end of the porous plug and the electrically conductive bonding layer or between the lower end of the porous plug and the electrically conductive plate. Therefore, it is possible to suppress electrical discharge around the lower end of the porous plug.

BRIEF DESCRIPTION OF THE DRAWINGS

FIGS. 6A to 6F are manufacturing process charts of the wafer placement table 10.

FIG. 9 is a partially enlarged sectional view showing another example of the bonding layer penetrating part 52a.

FIG. 10 is a partially enlarged sectional view showing another example of the bonding layer penetrating part 52a.

DETAILED DESCRIPTION OF THE INVENTION

Figure 1:
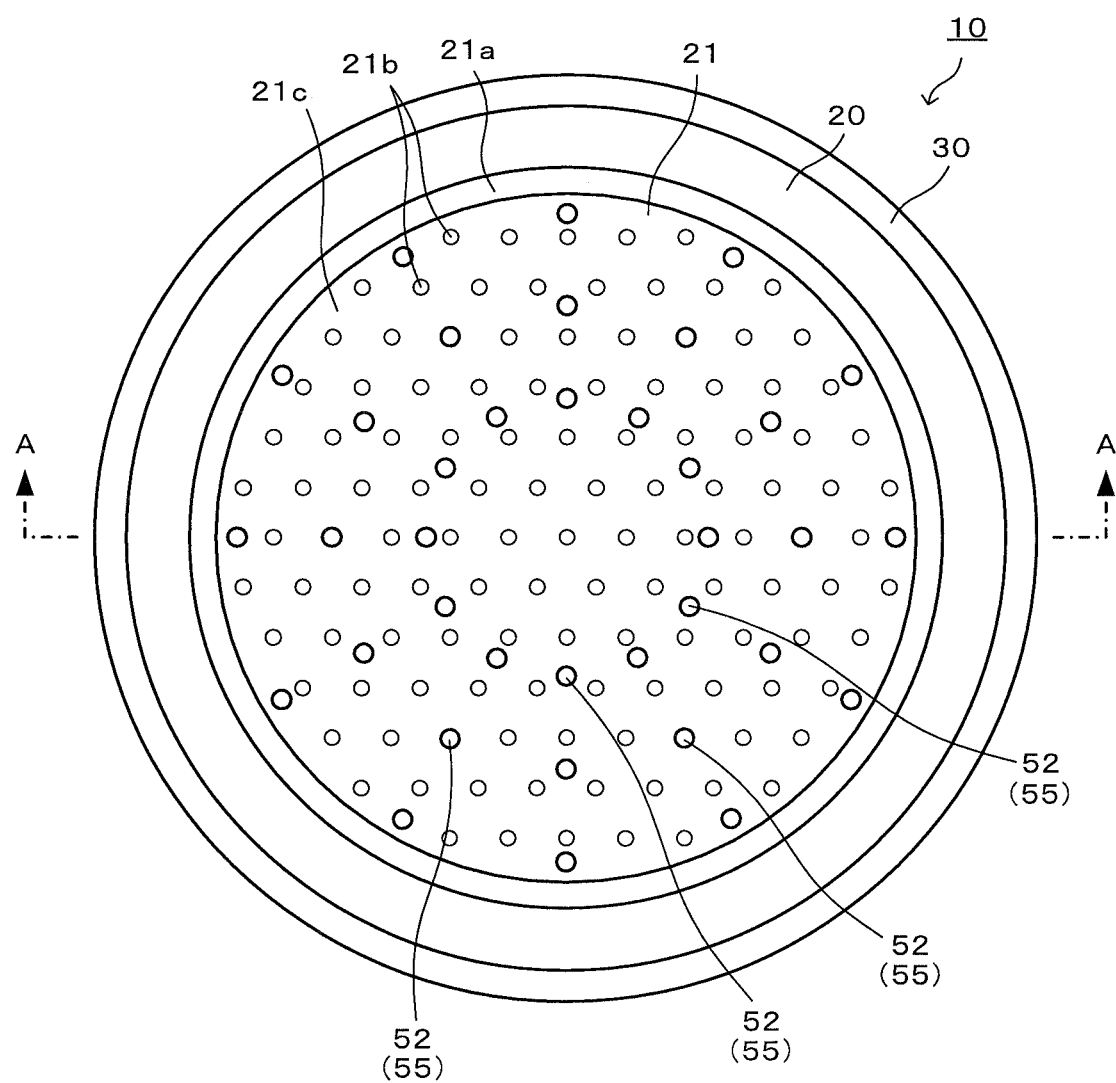
FIG. 1 is a plan view of a wafer placement table 10.
Figure 2:
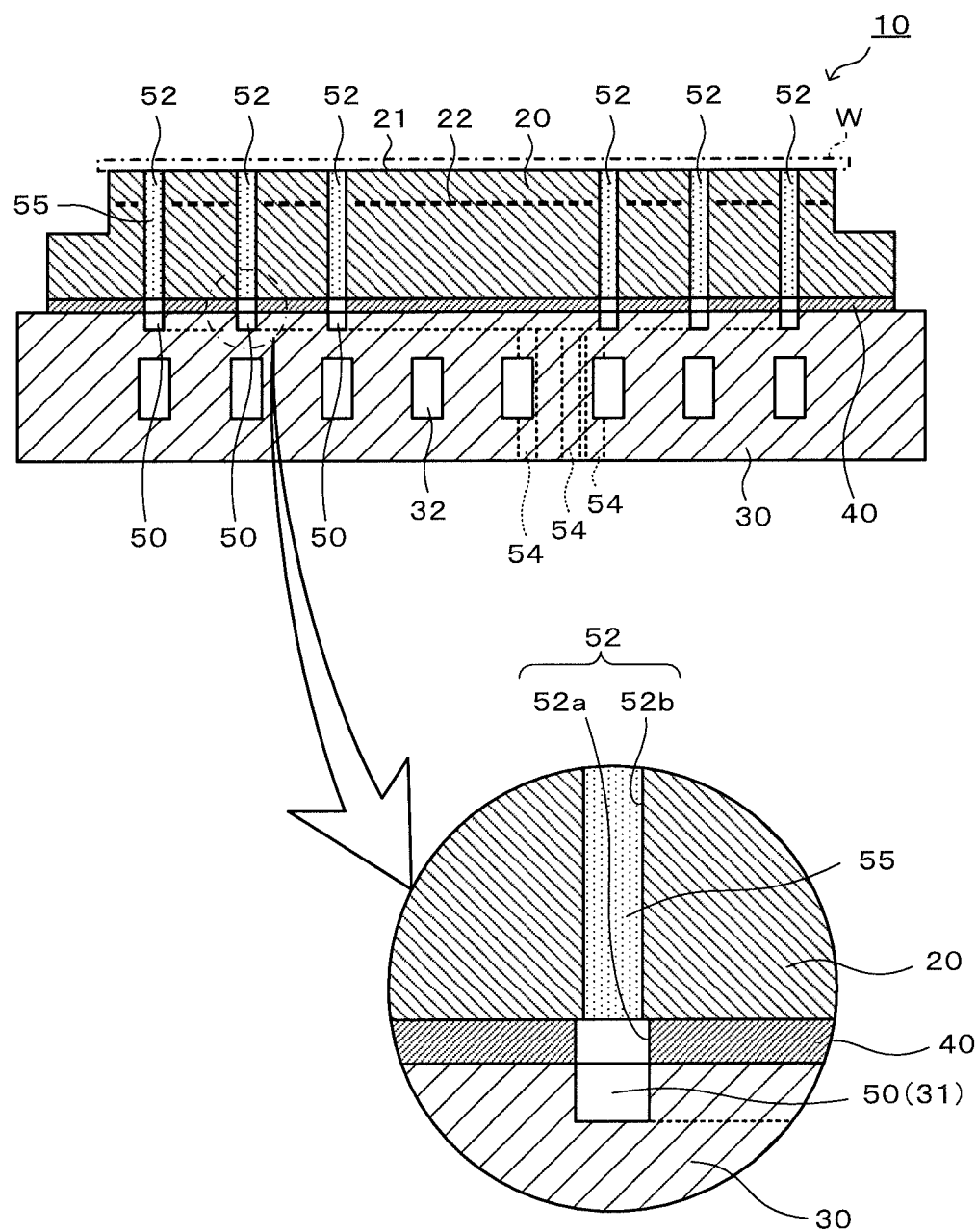
FIG. 2 is a sectional view taken along the line A-A in FIG. 1.
Figure 3:
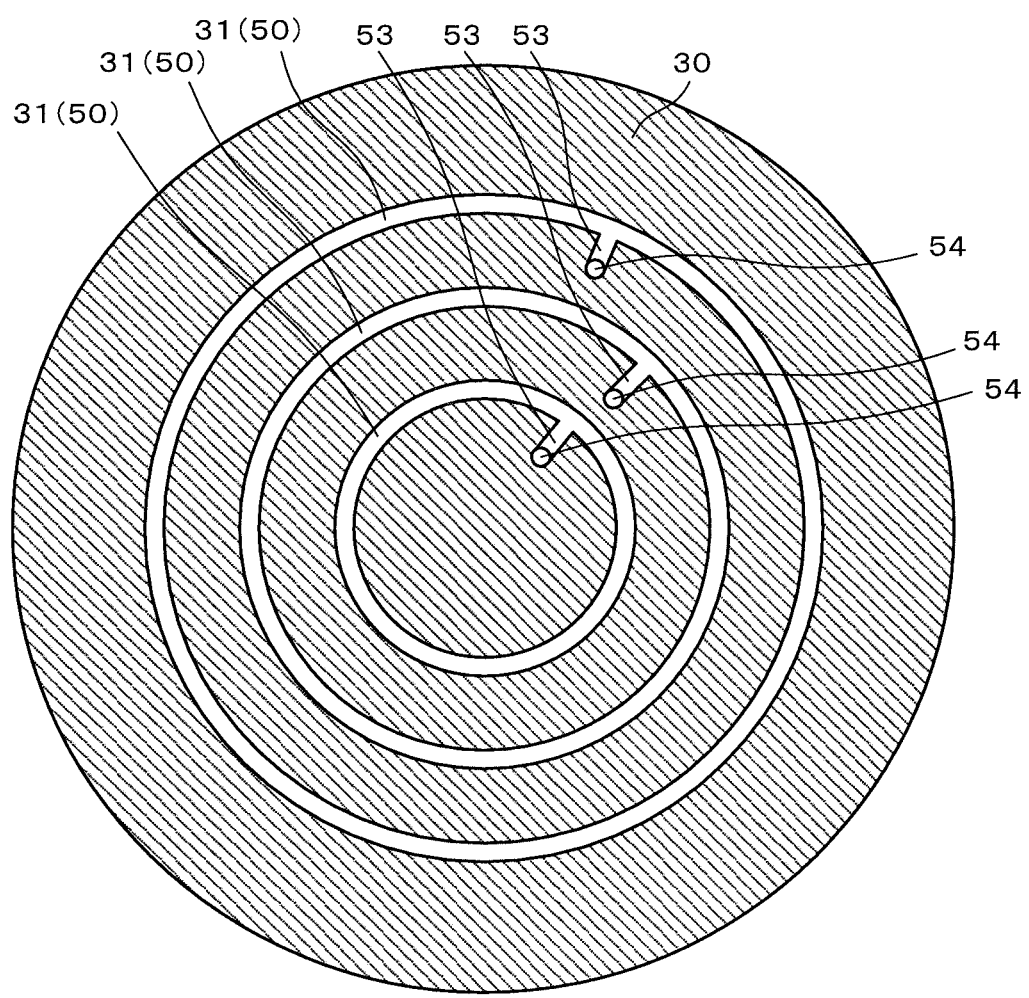
FIG. 3 is a sectional view of the wafer placement table 10, taken along a horizontal plane passing through gas intermediate passages 50 when viewed from above.
Figure 4:
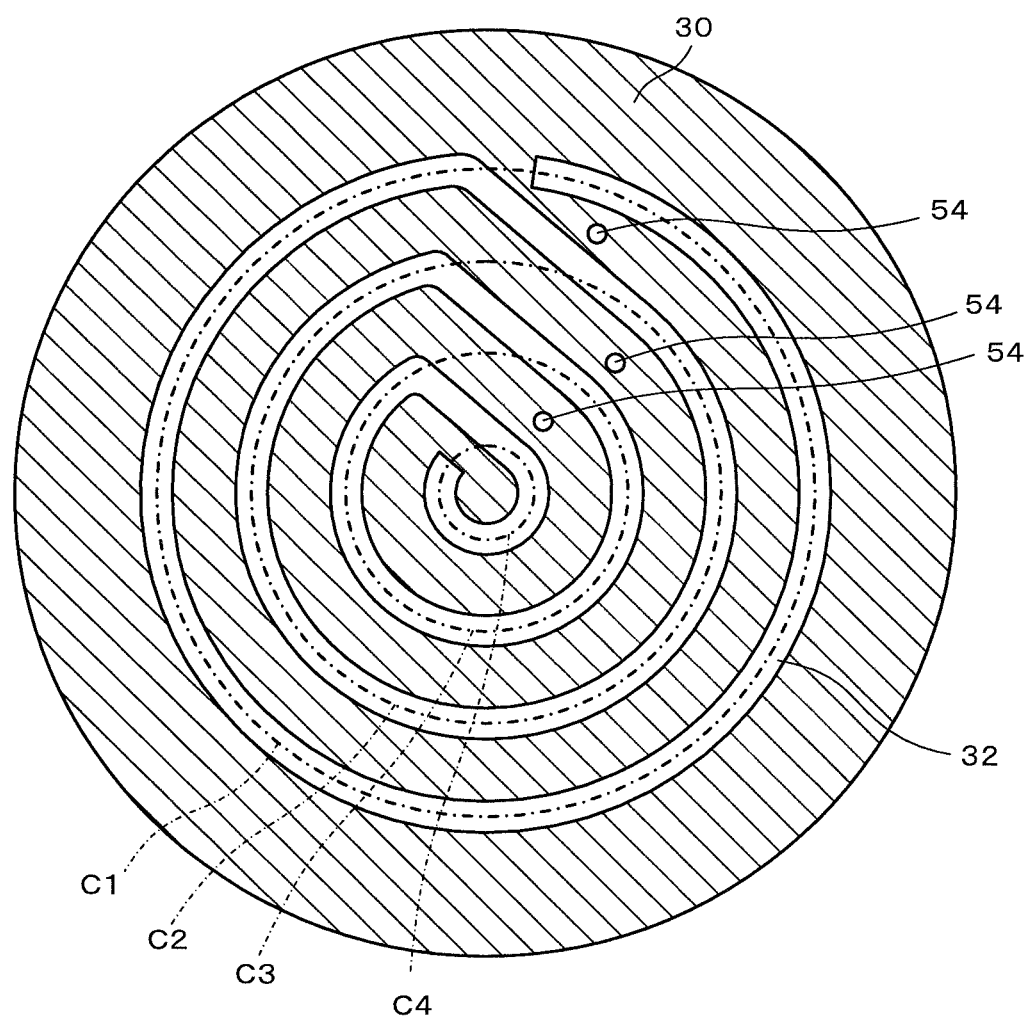
FIG. 4 is a sectional view of the wafer placement table 10, taken along a horizontal plane passing through a refrigerant flow channel 32 when viewed from above.
Figure 5:
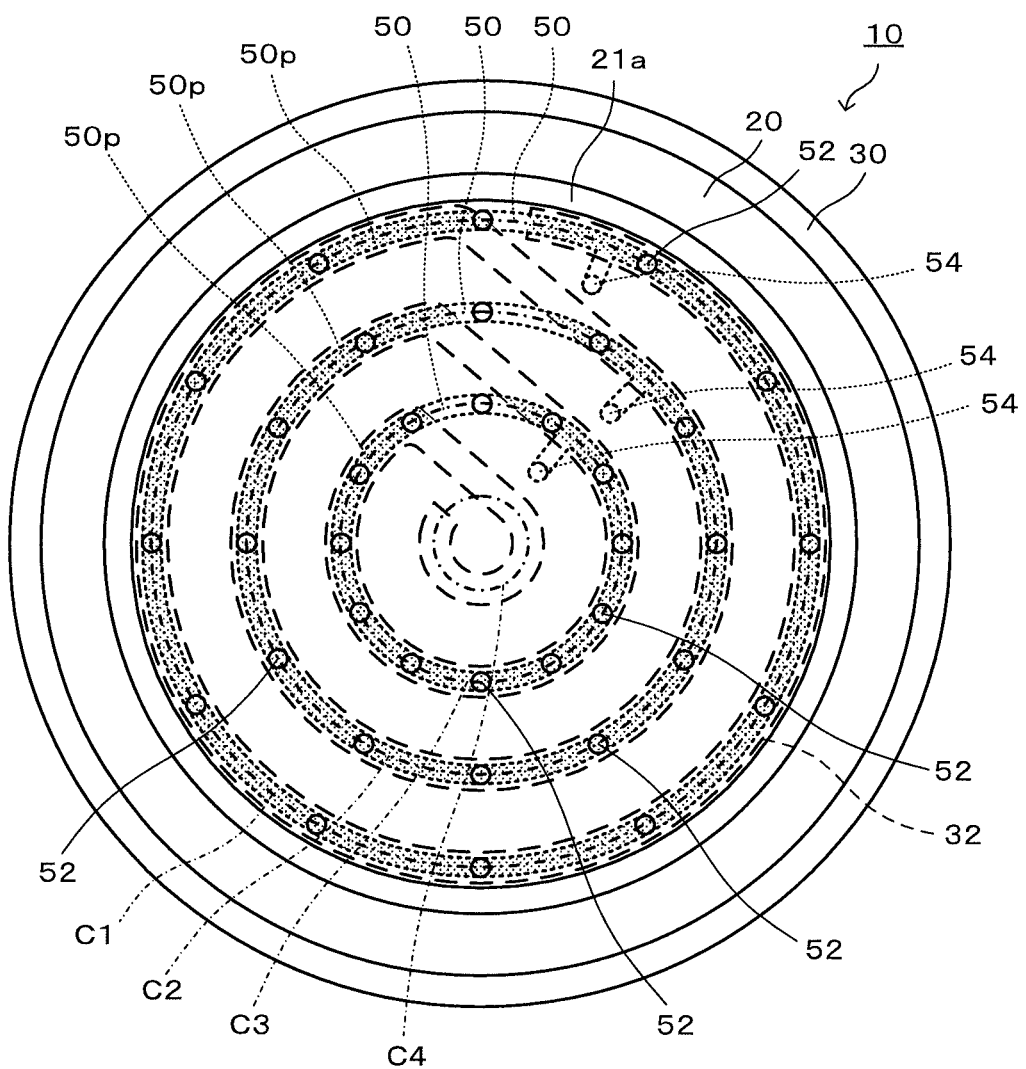
FIG. 5 is a view in which the refrigerant flow channel 32 and the like are drawn in the plan view of the wafer placement table 10.

Next, an embodiment of the present invention will be described with reference to the accompanying drawings. FIG. 1 is a plan view of a wafer placement table 10. FIG. 2 is a sectional view taken along the line A-A in FIG. 1. FIG. 3 is a sectional view of the wafer placement table 10, taken along a horizontal plane passing through gas intermediate passages 50 when viewed from above. FIG. 4 is a sectional view of the wafer placement table 10, taken along a horizontal plane passing through a refrigerant flow channel 32 when viewed from above. FIG. 5 is a view in which the refrigerant flow channel 32 and the like are drawn in the plan view of the wafer placement table 10. In the specification, the words "up" and "down" do not indicate an absolute positional relationship. Therefore, depending on the orientation of the wafer placement table 10, "up" and "down" can be "down" and "up" or can be "left" and "right" or can be "front" and "rear".

As shown in FIG. 2, the wafer placement table 10 includes a ceramic plate 20, a cooling plate 30, an electrically conductive bonding layer 40, gas intermediate passages 50, gas supply passages 52, and gas introduction passages 54.

The ceramic plate 20 is a ceramic disk (for example, a diameter of 300 mm and a thickness of 5 mm), such as alumina sintered body and aluminum nitride sintered body. The top surface of the ceramic plate 20 is a wafer placement surface 21 on which a wafer W is placed. The ceramic plate 20 incorporates an electrode 22. As shown in FIG. 1, on the wafer placement surface 21 of the ceramic plate 20, an annular seal band 21a is formed along the outer edge, and a plurality of circular small projections 21b is formed all over the surface on the inner side of the seal band 21a. The seal band 21a and the circular small projections 21b have the same height and have a height of, for example, several micrometers to several tens of micrometers. The electrode 22 is a planar mesh electrode used as an electrostatic electrode and is connected to an external direct-current power supply via a power supply member (not shown). A low pass filter is disposed in the middle of the power supply member. The power supply member is electrically insulated from the electrically conductive bonding layer 40 and the cooling plate 30. When a direct-current voltage is applied to the electrode 22, a wafer W is attracted and fixed to the wafer placement surface 21 (specifically, the top surface of the seal band and the top surfaces of the circular small projections) by electrostatic attraction force. When application of direct-current voltage is stopped, attraction and fixation of the wafer W to the wafer placement surface 21 are released. Part of the wafer placement surface 21 where the seal band 21a or the circular small projections 21b are not provided is referred to as a reference surface 21c.

The cooling plate 30 is an electrically conductive disk having good thermal conductivity (a disk having a diameter equal to or greater than the diameter of the ceramic plate 20). The refrigerant flow channel 32 in which refrigerant circulates is formed in the cooling plate 30. Refrigerant flowing through the refrigerant flow channel 32 is preferably liquid and preferably has electrically insulating properties. Examples of the liquid having electrically insulating properties include fluoroinert fluid. The refrigerant flow channel 32 is formed in a one-stroke pattern from one end (inlet) to the other end (outlet) over the entire area of the cooling plate 30 in plan view. As shown in FIG. 4, the refrigerant flow channel 32 is provided so as to be routed in a one-stroke pattern from one end to the other end in accordance with multiple circles disposed such that a plurality of imaginary circles (alternate long and short-dashed line circles C1 to C4; here, the circles C1 to C4 are concentric circles) having different diameters in plan view. Specifically, to route the refrigerant flow channel 32 in a one-stroke pattern from one end to the other end, the refrigerant flow channel 32 is routed so as to trace the imaginary circles while connecting two inner and outer imaginary circles of the multiple circles. A supply port and collection port of an external refrigerant apparatus (not shown) are respectively connected to one end and the other end of the refrigerant flow channel 32. Refrigerant supplied from the supply port of the external refrigerant apparatus to one end of the refrigerant flow channel 32 passes through the refrigerant flow channel 32 and then returns to the collection port of the external refrigerant apparatus from the other end of the refrigerant flow channel 32, the refrigerant is adjusted in temperature, and then the refrigerant is supplied to one end of the refrigerant flow channel 32 through the supply port again. The cooling plate 30 is connected to a radio-frequency (RF) power supply and is also used as an RF electrode.

Examples of the material of the cooling plate 30 include a metal material and a composite material of metal and ceramics. Examples of the metal material include Al, Ti, Mo, and alloys of them. Examples of the composite material of metal and ceramics include a metal matrix composite material (MMC) and a ceramic matrix composite material (CMC). Specific examples of such composite materials include a material including Si, SiC, and Ti (also referred to as SiSiCTi), a material obtained by impregnating an SiC porous body with Al and/or Si, and a composite material of $Al_2O_3$ and TiC. A material having a coefficient of thermal expansion close to that of the material of the ceramic plate 20 is preferably selected as the material of the cooling plate 30.

The electrically conductive bonding layer 40 is, for example, a metal bonding layer and bonds the bottom surface of the ceramic plate 20 with the top surface of the cooling plate 30. The electrically conductive bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material.

DESCRIPTION OF EMBODIMENTS

Each of the gas intermediate passages 50 is a horizontal space and is provided parallel to the wafer placement surface 21 at a location closer to the wafer placement surface 21 than the refrigerant flow channel 32 in the wafer placement table 10 (here, an interface between the electrically conductive bonding layer 40 and the cooling plate 30). The state "parallel" includes not only a completely parallel state but also a state that falls within the range of an allowable error (for example, tolerance) even when the state is not completely parallel. The gas intermediate passages 50 each have a recessed groove 31 provided on the top surface of the cooling plate 30 and are formed when the top surfaces of the recessed grooves 31 are covered with the electrically conductive bonding layer 40. As shown in FIG. 5, each of the gas intermediate passages 50 is provided in an annular shape so as to overlap any one of the plurality of imaginary circles C1 to C4 in plan view. Specifically, of the three gas intermediate passages 50, the first gas intermediate passage 50 from the outer periphery of the wafer placement table 10 overlaps the imaginary circle C1 with the greatest diameter, the second gas intermediate passage 50 overlaps the imaginary circle C2 with the second greatest diameter, and the third gas intermediate passage 50 overlaps the imaginary circle C3 with the third greatest diameter. Each of the gas intermediate passages 50 has an overlapping part 50p (the shaded parts in FIG. 5) that overlaps the refrigerant flow channel 32 along the refrigerant flow channel 32 in plan view. A state of overlapping the refrigerant flow channel 32 along the refrigerant flow channel 32 does not necessarily need to be a state where the center line of the refrigerant flow channel 32 in a length direction and the center line of the gas intermediate passage 50 in a length direction extend parallel along each other. The gas intermediate passages 50 do not need to completely overlap the refrigerant flow channel 32 over the entire refrigerant flow channel 32.

As shown in FIG. 2, the gas supply passages 52 are passages that extend from the gas intermediate passages 50 through the electrically conductive bonding layer 40 and the ceramic plate 20 in the up and down direction to the reference surface 21c (FIG. 1) of the wafer placement surface 21. Each of the gas supply passages 52 has a bonding layer penetrating part 52a extending through the electrically conductive bonding layer 40 and a ceramic plate penetrating part 52b extending through the ceramic plate 20. In the present embodiment, the diameter of the bonding layer penetrating part 52a is equal to or greater than the diameter of the ceramic plate penetrating part 52b. A plurality of (here, 12) the gas supply passages 52 is provided for each gas intermediate passage 50. Each of the gas supply passages 52 has an electrically insulating porous plug 55 that allows flow of gas. Here, the porous plug 55 is fixed in a state of being filled in the ceramic plate penetrating part 52b of the gas supply passage 52. Specifically, the outer peripheral surface of the porous plug 55 and the inner peripheral surface of the ceramic plate penetrating part 52b may be bonded to each other, or an external thread portion provided on the outer peripheral surface of the porous plug 55 may be screwed to an internal thread portion provided on the inner peripheral surface of the ceramic plate penetrating part 52b. The top surface of the porous plug 55 is located at the same level with the reference surface 21c of the wafer placement surface 21. The bottom surface of the porous plug 55 is located at the same level with the bottom surface of the ceramic plate 20. A porous bulk body obtained by sintering using ceramic powder may be used as the porous plug 55. For example, alumina, aluminum nitride, or the like may be used as ceramics. The porous plug 55 preferably has a porosity of higher than or equal to 30% and preferably has a mean pore size of greater than or equal to 20 μm.

Each of the gas introduction passages 54 is provided so as to extend through the cooling plate 30 in the up and down direction and communicate with the gas intermediate passage 50 via a gas auxiliary passage 53 (FIG. 3). The gas auxiliary passage 53 is a passage that connects the gas introduction passage 54 with the gas intermediate passage 50 and is provided parallel to the wafer placement surface 21 at the interface between the electrically conductive bonding layer 40 and the cooling plate 30. The plurality of gas supply passages 52 is provided for each gas intermediate passage 50. The number of the gas introduction passages 54 (here, one) is less than the number of the gas supply passages 52. The gas introduction passages 54 extend through the cooling plate 30 in the up and down direction between parts of the refrigerant flow channel 32.

Next, an example of use of the thus configured wafer placement table 10 will be described. Initially, in a state where the wafer placement table 10 is placed in a chamber (not shown), a wafer W is mounted on the wafer placement surface 21. Then, the inside of the chamber is decompressed by a vacuum pump and adjusted into a predetermined degree of vacuum, electrostatic attraction force is generated by applying a direct-current voltage to the electrode 22 of the ceramic plate 20, and the wafer W is attracted and fixed to the wafer placement surface 21 (specifically, the top surface of the seal band 21a or the top surfaces of the circular small projections 21b). Subsequently, the inside of the chamber is set to a reaction gas atmosphere with a predetermined pressure (for example, several tens to several hundreds of pascals). In this state, plasma is generated by applying an RF voltage between an upper electrode (not shown) provided at a ceiling part in the chamber and the cooling plate 30 of the wafer placement table 10. The surface of the wafer W is processed by the generated plasma. Refrigerant circulates through the refrigerant flow channel 32 of the cooling plate 30. Back-side gas is introduced from a gas cylinder (not shown) to the gas introduction passages 54. Heat transfer gas (for example, He gas or the like) may be used as the back-side gas. The back-side gas introduced into the gas introduction passages 54 passes through the gas intermediate passages 50 and is distributed to the plurality of gas supply passages 52. The back-side gas is supplied and encapsulated in a space between the back surface of the wafer W and the reference surface 21c of the wafer placement surface 21. With the presence of the back-side gas, heat transfer between the wafer W and the ceramic plate 20 is efficiently performed.

Next, an example of manufacture of the wafer placement table 10 will be described with reference to FIGS. 6A to 6F. FIGS. 6A to 6F are manufacturing process charts of the wafer placement table 10. Here, the case in which the cooling plate 30 is made from an MMC will be illustrated. First, the ceramic plate 20 incorporating the electrode 22 is prepared (FIG. 6A). For example, a molded body of ceramic powder, incorporating the electrode 22, is made, and the ceramic plate 20 is obtained by firing the molded body by hot pressing. The ceramic plate penetrating parts 52b that will be finally parts of the gas supply passages 52 are formed in the ceramic plate 20 (FIG. 6B). The ceramic plate penetrating parts 52b are formed so as to extend through the ceramic plate 20 in the up and down direction off the electrode 22.

Concurrently, two MMC disk members 81, 82 are prepared (FIG. 6C). Grooves and holes are formed as needed in the MMC disk members 81, 82 by machining (FIG. 6D). Specifically, a recessed groove 32a that will be finally the refrigerant flow channel 32 is formed on the bottom surface of the upper-side MMC disk member 81, and recessed grooves 31 that will be finally the gas intermediate passages 50 are formed on the top surface of the MMC disk member 81. Through-holes 54a that will be finally parts of the gas introduction passages 54 are formed so as to extend from the recessed grooves 31 to the bottom surface of the MMC disk member 81. In addition, through-holes 54a that will be finally parts of the gas introduction passages 54 are formed in the lower-side MMC disk member 82. When the ceramic plate 20 is made of alumina, the MMC disk members 81, 82 are preferably made of SiSiCTi or AlSiC. This is because the coefficient of thermal expansion of alumina and the coefficient of thermal expansion of SiSiCTi or AlSiC are almost the same.

The disk member made of SiSiCTi can be made by, for example, as follows. Initially, a powder mixture is made by mixing silicon carbide, metal Si and metal Ti. After that, a disk-shaped molded body is made by uniaxial pressing of the obtained powder mixture, and the molded body is sintered by hot pressing in an inert atmosphere, with the result that the disk member made of SiSiCTi is obtained.

Subsequently, after the ceramic plate 20, the MMC disk member 81, and the MMC disk member 82 are bonded by TCB, the overall shape is adjusted, and the porous plugs 55 are attached, with the result that the wafer placement table 10 is obtained (FIGS. 6E and 6F). Specifically, a laminated body is obtained by sandwiching a metal bonding material 83 between the top surface of the lower-side MMC disk member 82 and the bottom surface of the upper-side MMC disk member 81, and sandwiching a metal bonding material 90 between the top surface of the upper-side MMC disk member 81 and the bottom surface of the ceramic plate 20. Through-holes that will be finally parts of the gas introduction passages 54 are formed in advance in the metal bonding material 83, and through-holes that will be finally parts (bonding layer penetrating parts 52a) of the gas supply passages 52 are formed in advance in the metal bonding material 90. Subsequently, the laminated body is pressurized at a temperature lower than or equal to a solidus temperature of the metal bonding materials 83, 90 (for example, higher than or equal to a temperature obtained by subtracting 20° C. from the solidus temperature and lower than or equal to the solidus temperature) to perform bonding, after that the temperature is returned to a room temperature. Thus, the two MMC disk members 81, 82 are bonded by the metal bonding material 83 into the cooling plate 30. The ceramic plate 20 and the cooling plate 30 are bonded by the metal bonding material 90. The metal bonding material 90 becomes the electrically conductive bonding layer 40. An Al—Mg bonding material or an Al—Si—Mg bonding material may be used as the metal bonding materials 83, 90 at this time. When, for example, TCB is performed by using an Al—Si—Mg bonding material, the laminated body is pressurized in a state of being heated in a vacuum atmosphere. The metal bonding materials 83, 90 with a thickness of about 100 µl are preferable.

The wafer placement table 10 described in detail above has the gas intermediate passages 50 that are horizontal spaces. Each of the gas intermediate passages 50 is provided parallel to a wafer placement surface at a location closer to the wafer placement surface 21 than the refrigerant flow channel 32 in the wafer placement table 10 and has an overlapping part 50p (FIG. 5) that overlaps the refrigerant flow channel 32 along the refrigerant flow channel 32 in plan view. Since the gas intermediate passages 50 are cavities, parts where the gas intermediate passages 50 are formed transfer less heat than parts where the gas intermediate passages 50 are not formed. Part of a wafer W directly above the refrigerant flow channel 32 tends to decrease in temperature due to refrigerant. However, a decrease in temperature is suppressed by the overlapping part 50p of the gas intermediate passage 50 that is difficult to transfer heat. As a result, the soaking performance of a wafer W improves.

The refrigerant flow channel 32 is provided so as to be routed in a one-stroke pattern from one end to the other end in accordance with the multiple circles disposed such that the plurality of imaginary circles C1 to C4 having different diameters does not overlap each other in plan view, and each of the gas intermediate passages 50 is provided in an annular shape so as to overlap any one of the plurality of imaginary circles C1 to C4 in plan view. Therefore, the overlapping part 50p of each gas intermediate passage 50 is easily increased.

In addition, when gas is introduced through the gas introduction passage 54 that is open at the bottom surface of the cooling plate 30, the gas passes through the gas intermediate passage 50 and is distributed to the plurality of gas supply passages 52, and then the gas is supplied to the bottom surface of the wafer W. In the wafer placement table 10, the number of the gas introduction passages 54 extending through the cooling plate 30 is smaller than the number of the gas supply passages 52. Therefore, in comparison with the case where the number of the gas introduction passages 54 extending through the cooling plate 30 is equal to the number of the gas supply passages 52, the soaking performance of a wafer W improves.

Furthermore, the cooling plate 30 is an electrically conductive plate and is bonded to the bottom surface of the ceramic plate 20 via the electrically conductive bonding layer 40, and the gas intermediate passages 50 are provided at the interface between the electrically conductive bonding layer 40 and the cooling plate 30. Therefore, the electrically conductive bonding layer 40 that forms the top surfaces of the gas intermediate passages 50 and the cooling plate 30 that forms the bottom surfaces of the gas intermediate passages 50 are in contact with each other and have the same potential. Therefore, no potential gradient occurs between the upper and lower sides of the gas intermediate passages 50, so electrical discharge in the gas intermediate passages 50 is prevented.

Each of the gas supply passages 52 has the electrically insulating porous plug 55. Therefore, it is possible to suppress electrical discharge in the gas supply passages 52. If, for example, the porous plug 55 is not provided, electrons generated as a result of ionization of gas molecules accelerate and collide with other gas particles to cause arc discharge. However, when the porous plug 55 is provided, electrons collide with the porous plug 55 before colliding with other gas particles, so electrical discharge is suppressed.

Furthermore, the width of each gas intermediate passage 50 is preferably greater than or equal to 1 mm, and the depth of each gas intermediate passage 50 is preferably greater than or equal to 0.1 mm. When the width of each gas intermediate passage 50 is greater than or equal to 1 mm, the diameter of a grinding wheel used in forming the recessed grooves 31 is not too small, so machining time reduces, and machining cost is reduced. When the depth of each gas intermediate passage 50 is greater than or equal to 0.1 mm, gas easily flows through the gas intermediate passages 50. The thickness of part of the cooling plate 30 over the refrigerant flow channel 32 is preferably less than or equal to 3 mm. With this configuration, a large temperature difference is difficult to occur in the up and down direction in part of the cooling plate 30 over the refrigerant flow channel 32, and stress is difficult to be generated in that part, so it is possible to prevent breakage of the part by stress. In this case, the depth of each gas intermediate passage 50 is preferably greater than or equal to 0.1 mm and less than or equal to 2 mm.

Note that the present invention is in no way limited by the aforementioned embodiments, and can be naturally implemented in a variety of modes without departing from the technical scope of the present invention.

In the above-described embodiment, the gas supply passages 52 and the gas introduction passage 54 that communicate with the gas intermediate passage 50 serving as a horizontal space are provided; however, the configuration is not limited thereto. For example, in the above-described embodiment, it is also applicable that the gas introduction passage 54 that communicates with the gas intermediate passage 50 is provided and the gas supply passages 52 are not provided. In this case, the soaking of a wafer may be adjusted by introducing gas from the gas introduction passage 54 to the gas intermediate passage 50, then encapsulating the gas in the gas intermediate passage 50, and controlling gas pressure. Alternatively, in the above-described embodiment, it is also applicable that the gas intermediate passage 50 is provided and the gas supply passages 52 and the gas introduction passage 54 are not provided. In this case, each of the gas intermediate passages 50 is a closed space.

Figure 7:
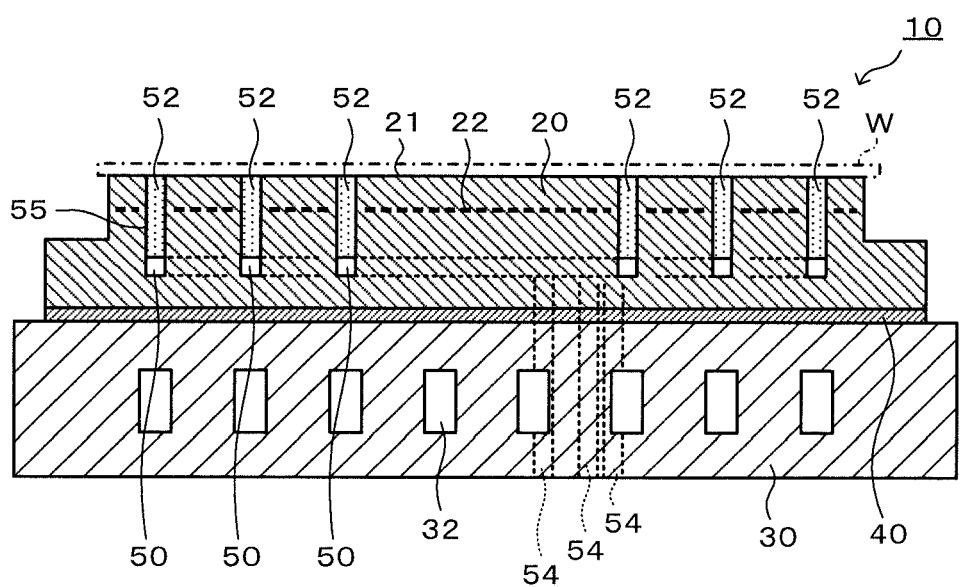
FIG. 7 is a longitudinal sectional view of an example in which the gas intermediate passage 50 is provided in a ceramic plate 20.

In the above-described embodiment, each of the gas intermediate passages 50 is provided at the interface between the electrically conductive bonding layer 40 and the cooling plate 30. Alternatively, each of the gas intermediate passages 50 may be provided in the ceramic plate 20 (below the electrostatic electrode 40). An example of this configuration is shown in FIG. 7. In FIG. 7, like reference signs are assigned to the same components as those of the above-described embodiment. Alternatively, each of the gas intermediate passages 50 may be provided in part of the cooling plate 30 on the upper side of the refrigerant flow channel 32.

Figure 8:
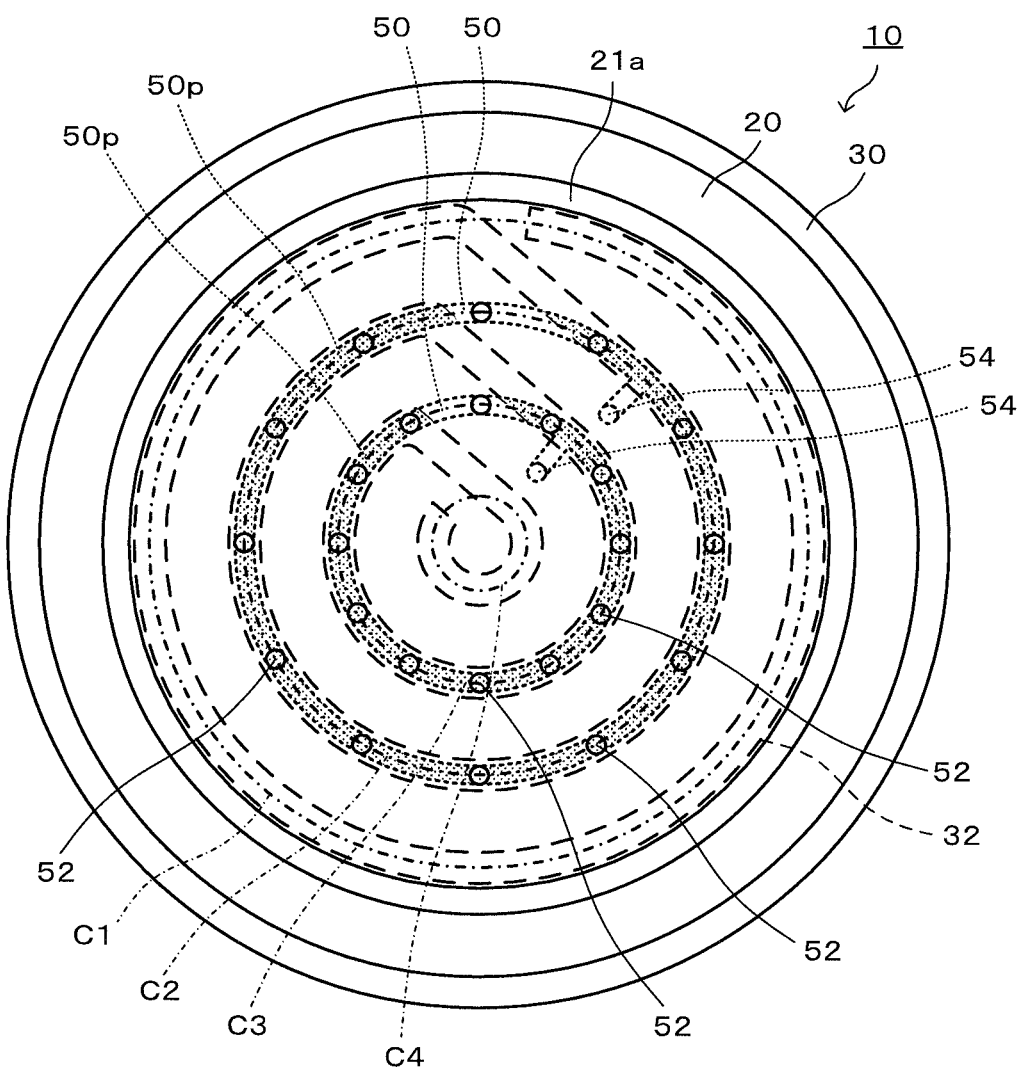
FIG. 8 is a view illustrating an example in which the gas intermediate passage 50 does not overlap the outermost periphery of the refrigerant flow channel 32.

In the above-described embodiment, as shown in FIG. 8, each of the gas intermediate passages 50 may be formed so as not to overlap the outermost peripheral imaginary circle C1 of the plurality of imaginary circles C1 to C4. In FIG. 8, like reference signs are assigned to the same components as those of the above-described embodiment. In processing a wafer W with plasma, the outermost peripheral region of the wafer W tends to have a relatively high temperature. Therefore, it is preferable to actively dissipate heat from the outermost peripheral region of the wafer W by not providing the gas intermediate passage 50 in part of the refrigerant flow channel 32 directly above the outermost peripheral region.

In the above-described embodiment, when viewed in plan, the total of the length of a region in which the center line of each gas intermediate passage 50 overlaps the refrigerant flow channel 32 is preferably higher than or equal to 75% of the total of the length of the center line of each gas intermediate passage 50.

Figure 9:
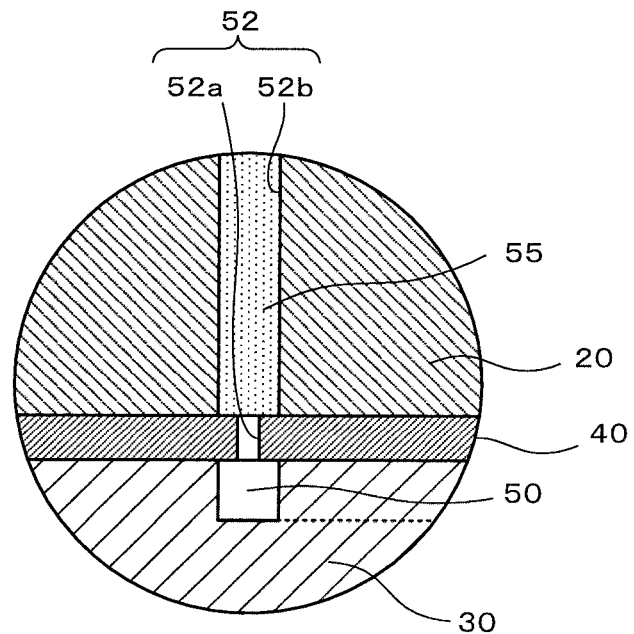
Figure 10:
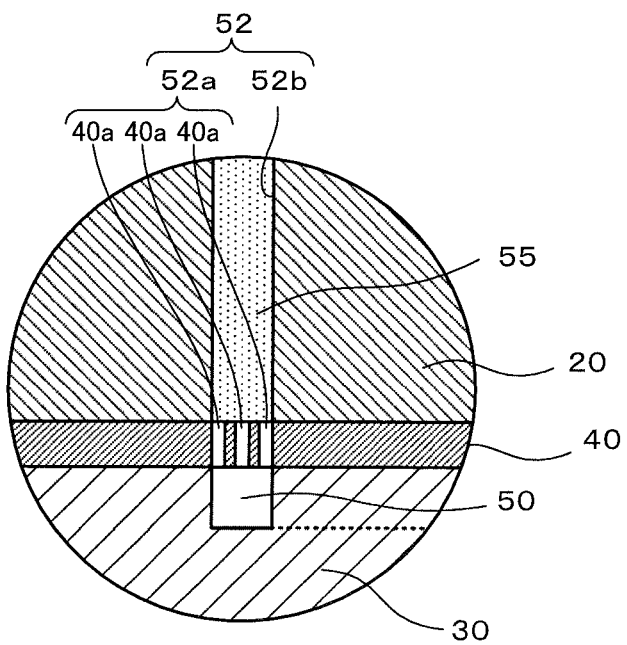

In the above-described embodiment, the lower end of the porous plug 55 may contact with the electrically conductive bonding layer 40. For example, as shown in FIG. 9, the lower end of the porous plug 55 may be configured to contact with the electrically conductive bonding layer 40 by reducing the hole diameter of each bonding layer penetrating part 52a as compared to the hole diameter of each ceramic plate penetrating part 52b in the gas supply passage 52. The hole diameter of each bonding layer penetrating part 52a is preferably less than or equal to 5 mm. Alternatively, as shown in FIG. 10, the bonding layer penetrating part 52a of each gas supply passage 52 is made up of a plurality of small holes 40a of which the hole diameter is less than the hole diameter of each ceramic plate penetrating part 52b. Thus, the lower end of the porous plug 55 may be configured to contact with the electrically conductive bonding layer 40. The hole diameter of each small hole 40a is preferably less than or equal to 5 mm. In FIGS. 9 and 10, like reference signs are assigned to the same components as those of the above-described embodiment. In any of FIGS. 9 and 10, no potential gradient occurs between the lower end of the porous plug 55 and the electrically conductive bonding layer 40 or between the lower end of the porous plug 55 and the cooling plate 30. Therefore, it is possible to suppress electrical discharge around the lower end of each porous plug 55. When the porous plug 55 is inserted in each of the gas supply passages 52, it is possible to bring the lower end of the porous plug 55 into contact with the electrically conductive bonding layer 40 only by inserting each of the porous plugs 55 until the porous plug 55 touches an area around a corresponding one of the bonding layer penetrating parts 52a of the electrically conductive bonding layer 40.

In the above-described embodiment, the porous plug 55 is filled in each ceramic plate penetrating part 52b of the gas supply passage 52; however, the configuration is not limited thereto. For example, the porous plug 55 may be filled in the entire gas supply passage 52 (the bonding layer penetrating part 52a and the ceramic plate penetrating part 52b) or the lower end of the porous plug 55 may reach the bottom surface of the gas intermediate passage 50. In this case as well, as in the case of FIGS. 7 and 8, no potential gradient occurs between the lower end of the porous plug 55 and the electrically conductive bonding layer 40 or between the lower end of the porous plug 55 and the cooling plate 30. Therefore, it is possible to suppress electrical discharge around the lower end of each porous plug 55.

Figure 11:
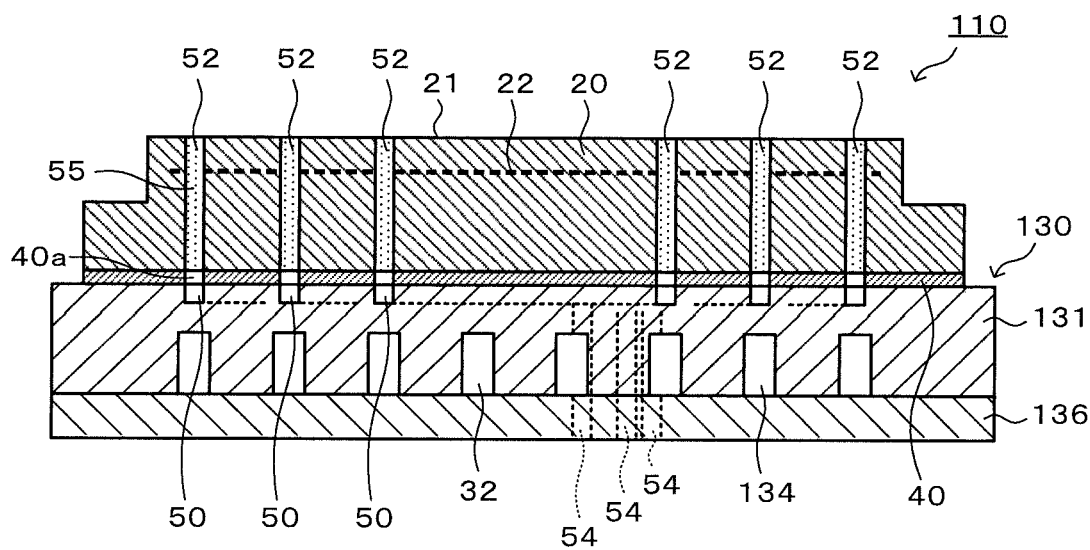
FIG. 11 is a longitudinal sectional view of a wafer placement table 110.

In the above-described embodiment, an electrically conductive plate is illustrated as the cooling plate 30; however, the configuration is not limited thereto. For example, as in the case of a wafer placement table 110 shown in FIG. 11, a cooling plate 130 may include an electrically conductive plate 131 as an upper layer and a circular plate 136 as a lower layer. In FIG. 11, like reference signs are assigned to the same components as those of the above-described embodiment. The electrically conductive plate 131 has a refrigerant flow channel groove 134 on the bottom surface. The refrigerant flow channel 32 is formed by closing the lower opening of the refrigerant flow channel groove 134 with the circular plate 136 disposed on the bottom surface of the electrically conductive plate 131. The electrically conductive plate 131 and the circular plate 136 are united by a clamp mechanism (not shown) provided on the outer peripheral side in a state of being sealed in a liquid-tight manner such that no refrigerant leaks from the refrigerant flow channel 32 to the outer peripheral side. Each of the gas introduction passages 54 is made up of a part passing through the electrically conductive plate 131 and a part passing through the circular plate 136. A joint between both parts (between the electrically conductive plate 131 and the circular plate 136) is airtightly sealed. The electrically conductive plate 131 and the circular plate 136 both may be made of the same material (for example, MMC). Alternatively, the electrically conductive plate 131 may be made of an expensive material (for example, MMC), and the circular plate 136 may be made of a material (for example, metals, such as aluminum and aluminum alloys, ceramics, such as alumina, and the like) lower in cost than the material.

Figure 12:
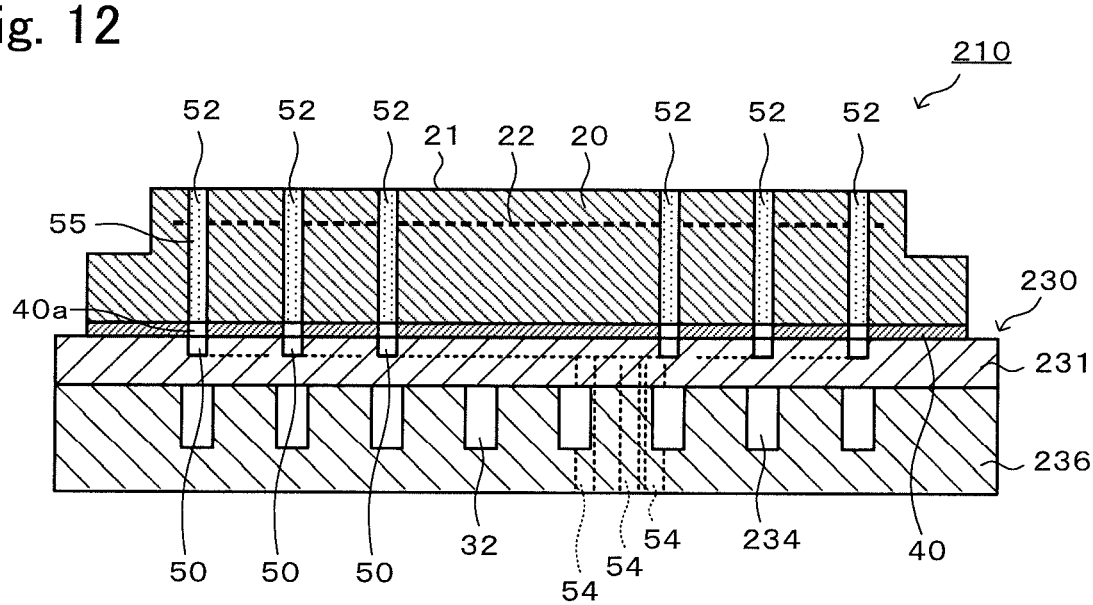
FIG. 12 is a longitudinal sectional view of a wafer placement table 210.

Alternatively, as in the case of a wafer placement table 210 shown in FIG. 12, a cooling plate 230 may include an electrically conductive plate 231 as an upper layer and a circular plate 236 as a lower layer. In FIG. 12, like reference signs are assigned to the same components as those of the above-described embodiment. The electrically conductive plate 231 does not have a refrigerant flow channel or a refrigerant flow channel groove. The circular plate 236 has a refrigerant flow channel groove 234 on the top surface. The refrigerant flow channel 32 is formed by closing the upper opening of the refrigerant flow channel groove 234 with the electrically conductive plate 231. The electrically conductive plate 231 and the circular plate 236 are united by a clamp mechanism (not shown) provided on the outer peripheral side in a state of being sealed in a liquid-tight manner such that no refrigerant leaks from the refrigerant flow channel 32 to the outer peripheral side. Each of the gas introduction passages 54 is made up of a part passing through the electrically conductive plate 231 and a part passing through the circular plate 236. A joint between both parts (between the electrically conductive plate 231 and the circular plate 236) is airtightly sealed. The electrically conductive plate 231 and the circular plate 236 both may be made of the same material (for example, MMC). Alternatively, the electrically conductive plate 231 may be made of an expensive material (for example, MMC), and the circular plate 236 may be made of a material (for example, metals, such as aluminum and aluminum alloys, ceramics, such as alumina, and the like) lower in cost than the material.

In the above-described embodiment, the porous plug 55 is disposed in the gas supply passage 52; however, the porous plug 55 does not need to be disposed in the gas supply passage 52.

In the above-described embodiment, each gas intermediate passage 50 has a recessed groove 31 (first recessed portion) provided on the top surface of the cooling plate 30 and formed by disposing the bottom surface (flat surface) of the electrically conductive bonding layer 40 on the recessed groove 31; however, the configuration is not limited thereto. For example, each gas intermediate passage 50 may have a recessed groove (second recessed portion) provided on the bottom surface of the electrically conductive bonding layer 40, and the top surface (flat surface) of the cooling plate 30 may be disposed under the recessed groove. In this case, the electrically conductive bonding layer 40 may have a top and bottom two-layer structure, a groove (a groove extending through in the up and down direction) that will be finally the gas intermediate passage 50 may be provided in the bottom layer, and the above-described bonding layer penetrating part 52a may be provided in the top layer. With this configuration as well, the wafer placement table 10 can be relatively easily manufactured.

In the above-described embodiment, the top surface of the porous plug 55 has the same level as the reference surface 21c of the wafer placement surface 21; however, the configuration is not limited thereto. For example, a difference obtained by subtracting the height of the top surface of the porous plug 55 from the height of the reference surface 21c of the wafer placement surface 21 may be less than or equal to 0.5 mm (preferably less than or equal to 0.2 mm, more preferably less than or equal to 0.1 mm). In other words, the top surface of the porous plug 55 may be disposed at a position lower by 0.5 mm or less (preferably 0.2 mm or less, more preferably 0.1 mm or less) than the reference surface 21c of the wafer placement surface 21. With this configuration as well, the height of the space between the bottom surface of a wafer W and the top surface of the porous plug 55 is suppressed to a relatively low height. Therefore, it is possible to prevent occurrence of arc discharge in this space.

In the above-described embodiment, the electrostatic electrode is incorporated in the ceramic plate 20 as the electrode 22. Instead of or in addition to this, a heater electrode (resistance heating element) may be incorporated. In this case, a heater power supply is connected to the heater electrode. The ceramic plate 20 may incorporate one layer of electrode or may incorporate two or more layers of electrode with a gap.

In the above-described embodiment, lift pin holes extending through the wafer placement table 10 may be provided. The lift pin holes are holes for allowing insertion of lift pins used to raise and lower a wafer W with respect to the wafer placement surface 21. The lift pin holes are provided at three locations when a wafer W is supported by, for example, three lift pins. When through-holes like lift pin holes are present, the temperature tends to increase around such the through-holes, so it is applicable that each of the gas intermediate passages 50 does not overlap the refrigerant flow channel 32.

In the above-described embodiment, it is also applicable that part of the refrigerant flow channel 32 around an inlet where a refrigerant temperature is low overlaps the gas intermediate passage 50 and part of the refrigerant flow channel 32 around an outlet where a refrigerant temperature is high does not overlap the gas intermediate passage 50.

In the above-described embodiment, the ceramic plate 20 is made by firing a ceramic powder molded body by hot pressing. The molded body at that time may be made by laminating a plurality of tape molds, or may be made by mold casting, or may be made by compacting ceramic powder.

In the above-described embodiment, the ceramic plate 20 and the cooling plate 30 are bonded by the electrically conductive bonding layer 40; however, the configuration is not limited to the electrically conductive bonding layer 40. For example, instead of the electrically conductive bonding layer 40, a resin bonding layer may be used. When a resin bonding layer is used, an electrically conductive filler (for example, a metal filler) may be added to a resin to increase thermal conductivity.

In the above-described embodiment, an example in which the refrigerant flow channel 32 is formed in a one-stroke pattern has been described; however, the configuration is not limited thereto. For example, the refrigerant flow channel 32 may have a branch halfway. Alternatively, a plurality of parallel flow channels may be provided from one end to the other end of the refrigerant flow channel 32. An imaginary circle that is used in providing the refrigerant flow channel 32 may be deformed at a location off a singular point (for example, a terminal or the like).

The present application claims priority from Japanese Patent Application No. 2022-058341, filed on Mar. 31, 2022, the entire contents of which are incorporated herein by reference.

What is claimed is:

1. A wafer placement table in which a cooling plate having a refrigerant flow channel is provided on a bottom surface side of a ceramic plate having a wafer placement surface on a top surface of the ceramic plate and incorporating an electrode, the wafer placement table comprising
   a horizontal space provided parallel to the wafer placement surface at a location closer to the wafer placement surface than the refrigerant flow channel in the wafer placement table and having an overlapping part that overlaps the refrigerant flow channel along the refrigerant flow channel in plan view,
   the cooling plate is an electrically conductive plate or includes at least an electrically conductive plate in an upper layer,
   the electrically conductive plate is bonded to a bottom surface of the ceramic plate via an electrically conductive bonding layer,
   wherein the horizontal space comprises three or more annular shaped gas intermediate passages at a bonding interface of the electrically conductive bonding layer and the cooling plate,
   the wafer placement table has a plurality of gas supply passages extending from the three or more annular shaped gas intermediate passages to the wafer placement surface for supplying back-side gas to the wafer placement surface,
   wherein the overlapping part of the three or more annular shaped gas intermediate passages that overlap the refrigerant flow channel is greater than or equal to 75% of a total length of a center line of the three or more annular shaped gas intermediate passages when viewed in plan.

2. The wafer placement table according to claim 1, wherein
   the refrigerant flow channel is provided so as to be routed in a one-stroke pattern from one end to the other end in accordance with multiple circles disposed such that a plurality of imaginary circles having different diameters does not overlap each other in plan view, and
   the horizontal space is provided in an annular shape so as to overlap any one of the plurality of imaginary circles in plan view.

3. The wafer placement table according to claim 2, wherein
   the horizontal space does not overlap an outermost peripheral imaginary circle of the plurality of imaginary circles.

4. The wafer placement table according to claim 1, further comprising:
   a gas introduction passage provided so as to extend through the cooling plate in an up and down direction between parts of the refrigerant flow channel and communicate with the gas intermediate passage, the number of the gas introduction passages being smaller than the number of the gas supply passages communicating with the gas intermediate passage.

5. The wafer placement table according to claim 4, wherein
   each of the gas supply passages has an electrical insulating porous plug, and a lower end of the porous plug is in contact with at least one of the electrically conductive bonding layer or the electrically conductive plate.

6. The wafer placement table according to claim 5, wherein
   each of the gas supply passages has a bonding layer penetrating part extending through the electrically conductive bonding layer and a ceramic plate penetrating part extending through the ceramic plate,
   a diameter of the bonding layer penetrating part is less than a diameter of the ceramic plate penetrating part, and
   a lower end of the porous plug is in contact with an area around the bonding layer penetrating part in the electrically conductive bonding layer.

7. The wafer placement table according to claim 6, wherein
   the bonding layer penetrating part is made up of a plurality of holes of which a hole diameter is less than a hole diameter of each ceramic plate penetrating part.

8. The wafer placement table according to claim 1, wherein
   the three or more annular shaped gas intermediate passages and the plurality of gas supply passages include helium gas therein.

9. The wafer placement table according to claim 4, further comprising a gas auxiliary passage interconnecting the gas introduction passage with the gas intermediate passage, and wherein the gas auxiliary passage is parallel to the wafer placement surface and at the interface between the electrically conductive bonding layer and the cooling plate.

* * * * *